(12) United States Patent
Mathuria

(10) Patent No.: US 10,454,457 B1
(45) Date of Patent: Oct. 22, 2019

(54) SELF-GATING FLIP-FLOP

(71) Applicant: TEXAS INSTRUMENTS INCORPORATED, Dallas, TX (US)

(72) Inventor: Priyankar Mathuria, Benares (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/010,696

(22) Filed: Jun. 18, 2018

(51) Int. Cl.
*H03K 3/00* (2006.01)
*H03K 3/037* (2006.01)
*G01R 31/3185* (2006.01)
*H03K 3/012* (2006.01)
*H03K 19/21* (2006.01)

(52) U.S. Cl.
CPC ... *H03K 3/0372* (2013.01); *G01R 31/318536* (2013.01); *H03K 3/012* (2013.01); *H03K 19/215* (2013.01)

(58) Field of Classification Search
CPC .. H03K 3/037; H03K 3/012; H03K 3/356121; H03K 3/0375; H03K 3/356139
USPC .................................................. 327/208, 218
See application file for complete search history.

(56) References Cited

U.S. PATENT DOCUMENTS

| | | | |
|---|---|---|---|
| 6,646,487 B2* | 11/2003 | Nedovic | H03K 3/012 327/211 |
| 9,374,075 B2* | 6/2016 | Kwak | H03K 7/08 |
| 2015/0200652 A1* | 7/2015 | Berzins | H03K 3/012 327/225 |
| 2016/0049937 A1* | 2/2016 | Tong | H03K 19/0016 327/199 |
| 2017/0353186 A1* | 12/2017 | Ye | H03K 3/037 |

FOREIGN PATENT DOCUMENTS

JP 2014158176 A * 8/2014

* cited by examiner

*Primary Examiner* — Anh Q Tra
(74) *Attorney, Agent, or Firm* — Michael A. Davis, Jr.; Charles A. Brill; Frank D. Cimino

(57) ABSTRACT

A self-gating flip-flop circuit includes a flip-flop circuit and a clock circuit. The flip-flop circuit includes a clock input. The clock circuit is coupled to the clock input. The clock circuit includes a latch circuit, a reset circuit, and a gate circuit. The reset circuit is coupled to the latch circuit. The gate circuit is coupled to the latch circuit and the clock input.

17 Claims, 4 Drawing Sheets

SELF-GATING FLIP-FLOP

BACKGROUND

Many digital systems use flip-flops as storage and/or synchronization elements. In some circuits, the flip-flops consume a substantial portion of the circuit's power. The transistors receiving the clock input are responsible for most of the flip-flop's power consumption. The transistors receiving the clock input switch at every clock cycle, irrespective of whether the data input changes.

SUMMARY

A self-gating flip-flop circuit includes a flip-flop circuit and a clock circuit. The flip-flop circuit includes a clock input. The clock circuit is coupled to the clock input. The clock circuit includes a latch circuit, a reset circuit, and a gate circuit. The reset circuit is coupled to the latch circuit. The gate circuit is coupled to the latch circuit and the clock input.

A self-gating flip-flop circuit includes a data input terminal, a clock input terminal, a flip-flop circuit, and a clock circuit. The flip-flop circuit is coupled to the data input terminal. The clock circuit coupled to the flip-flop circuit and the data input terminal. The clock circuit configured to activate an internal clock signal to the flip-flop circuit responsive to a data signal at the data input terminal and a value stored in the flip-flop circuit being different logical values. The clock circuit is also configured to apply the internal clock signal to latch a signal that indicates the data signal at the data input terminal and the value stored in the flip-flop circuit are different logical values.

A self-gating flip-flop circuit includes a data input terminal, a clock input terminal, a flip-flop circuit, an exclusive-OR circuit, a latch circuit, a reset circuit, and a gate circuit. The flip-flop circuit is coupled to the data input terminal. The exclusive-OR circuit is coupled to the data input terminal and the flip-flop circuit. The latch circuit is coupled to the exclusive-OR circuit. The reset circuit is coupled to the latch circuit and the clock input terminal. The gate circuit is coupled to the latch circuit, the clock input terminal, and the flip-flop circuit. The latch circuit is transparent responsive to an output clock signal of the gate circuit being inactive and is latched responsive to the output of the gate circuit being active.

DETAILED DESCRIPTION

In this description, the term "couple" or "couples" means either an indirect or direct connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Flip-flop power consumption can be reduced be reducing the switching frequency of the transistors that receive the clock signal. For example, by reducing the switching frequency of the clock signal provided to the flip-flop, the power consumed by the flip-flop can be reduced. Some flip-flop circuits include an enable input that gates the clock signal provided to the circuit, such that the clock signal is provided to the flip-flop only while an enable signal is active. In such implementations, circuitry external to the flip-flop circuit must generate an enable signal that is suitable to control clocking of the flip-flop in a given application. Some flip-flop circuits include clock gating circuitry that controls the clock signal to a flip-flop, based on a comparison of the data stored in the flip-flop to a flip-flop data input value. For example, if the data input value is different from the value of the data stored in the flip-flop, then the clock gating circuitry passes a clock edge to the flip-flop, allowing the flip-flop to store the data input value. Conversely, if the data input value is the same as the value of the data stored in the flip-flop, then the clock gating circuitry does not pass a clock edge to the flip-flop, and the data stored in the flip-flop remains unchanged. Such self-gating flip-circuits can be more power efficient than flip-flops that lack clock gating. However, the clock input to such a circuit can still be connected to a substantial number of transistors, and each transistor connected to the clock input is a source of power consumption.

The self-gating flip-flops described herein reduce power consumption by reducing the number of transistors connected to the clock input. For example, some implementations of the self-gating flip-flops described herein connect as few as four transistors to the clock input.

Figure 1:
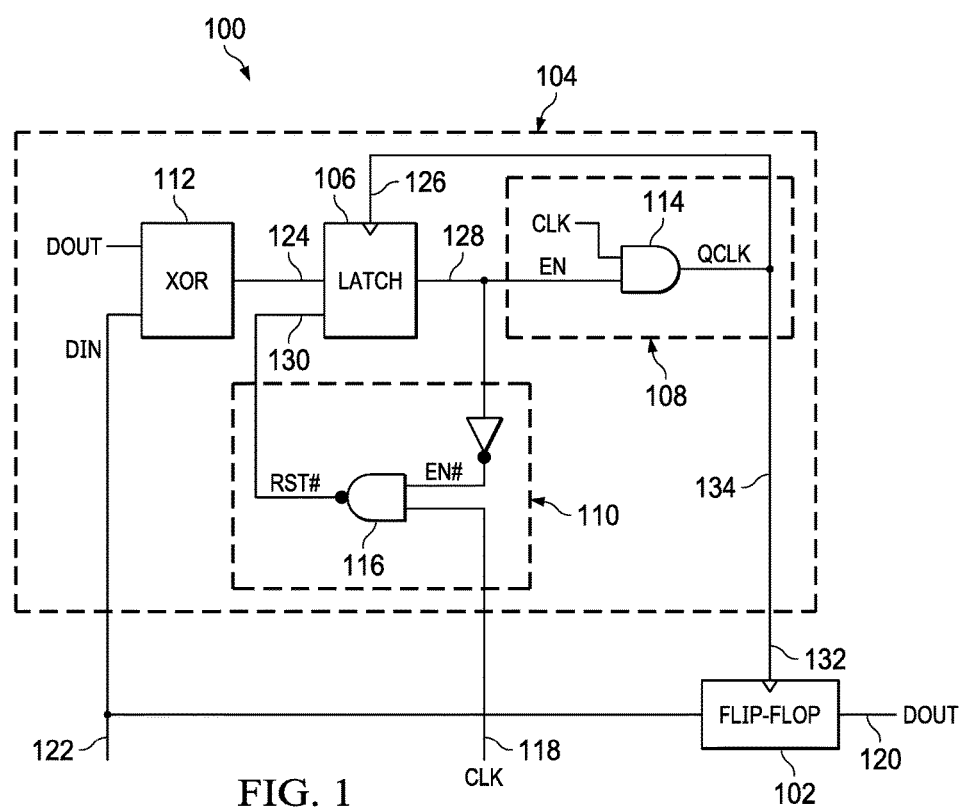
FIG. 1 is a high-level schematic diagram of an example self-gating flip-flop circuit in accordance with the described examples.

FIG. 1 is a high-level schematic diagram of an example self-gating flip-flop circuit 100 in accordance with the described examples. The self-gating flip-flop circuit 100 includes a flip-flop circuit 102 and a flip-flop clock circuit 104. The flip-flop clock circuit 104 is coupled to the flip-flop circuit 102 and provides an internal clock signal 134 to the flip-flop circuit 102 if the logical value of the data stored in the flip-flop circuit 102 is different from the logical value of the signal (DIN) at the data input terminal 122. For example, if the value stored in the flip-flop circuit 102 (i.e., DOUT at the output 120 of the flip-flop circuit 102) is a logic "0", and if the signal at the data input terminal 122 is a logic "1", then: the flip-flop clock circuit 104 will pass a clock to the flip-flop circuit 102; and the flip-flop circuit 102 will store the value of the signal that exists at the data input terminal 122. The flip-flop circuit 102 may be a master-slave flip-flop.

The flip-flop clock circuit 104 includes a latch circuit 106, a clock gate circuit 108, a latch reset circuit 110, and an exclusive-OR circuit 112. The exclusive-OR circuit 112 compares the value of the data stored in the flip-flop circuit 102 to the value of the signal at the data input terminal 122, and provides the result of the comparison to the latch circuit latch circuit 106. Accordingly, the exclusive-OR circuit 112 is connected to the data input terminal 122, the flip-flop circuit 102, and the latch circuit 106. The exclusive-OR circuit 112 may be implemented as an exclusive-OR (XOR) gate.

The latch circuit 106 receives the output of the exclusive-OR circuit 112. The latch circuit 106 is coupled to the exclusive-OR circuit 112, the clock gate circuit 108, and the latch reset circuit 110. The latch circuit 106 includes a data input terminal 124 that is coupled to the exclusive-OR circuit 112. The latch circuit 106 is configured to pass or store the output of the exclusive-OR circuit 112 for use by the clock gate circuit 108. The latch circuit 106 includes a latch control input 126 for receiving a signal that controls whether the latch circuit 106 passes or stores the output of the exclusive-OR circuit 112. The latch control input 126 is coupled to the clock gate circuit 108 to allow the clock signal generated by the clock gate circuit 108 to control whether the latch circuit 106 passes or stores the output of the exclusive-OR circuit 112. For example, if a clock signal generated by the clock gate circuit 108 is active, then the latch circuit 106 latches the output of the exclusive-OR circuit 112. Conversely, if the clock signal generated by the clock gate circuit 108 is inactive, then the latch circuit 106 passes the output of the exclusive-OR circuit 112. The signal output of the latch circuit 106, irrespective of whether passed or latched, is provided on a latch data output terminal 128. The latch circuit 106 also includes a reset terminal 130 for receiving a signal that controls resetting of the latch circuit 106.

The latch data output terminal 128 is coupled to the clock gate circuit 108 and the latch reset circuit 110. The clock gate circuit 108 generates the clock signal, which is provided to the clock input 132 of the flip-flop circuit 102 and to the latch control input 126 of the latch circuit 106. The clock gate circuit 108 is coupled to the latch data output terminal 128 and the clock input terminal 118, and receives (as its inputs) the output of the latch circuit 106 and the clock signal (CLK) at the clock input terminal 118. If the output of the latch circuit 106 is active (indicating that the logical value of the data stored in the flip-flop circuit 102 is different from the logical value of the signal at the data input terminal 122), and if the clock signal at the clock input terminal 118 is active, then the clock gate circuit 108 generates an output clock by passing a clock received via the clock input terminal 118. The clock gate circuit 108 may be implemented as an "AND" gate 114.

The latch reset circuit 110 generates the reset signal, which is provided to the reset terminal 130 to control resetting of the latch circuit 106. The latch reset circuit 110 is coupled to the latch data output terminal 128 and the clock input terminal 118, and receives (as inputs) the output of the latch circuit 106 and the clock signal at the clock input terminal 118. If the output of the latch circuit 106 is inactive (indicating that the logical value of the data stored in the flip-flop circuit 102 is the same as the logical value of the signal at the data input terminal 122), and if the clock signal at the clock input terminal 118 is active, then the latch reset circuit 110 generates an a signal to reset the latch circuit 106. The latch reset circuit 110 may be implemented as a "NAND" gate 116. Thus, the latch reset circuit 110 holds the latch circuit 106 reset while: the clock signal at the clock input terminal 118 is "high"; and the logical value of the data stored in the flip-flop circuit 102 is the same as the logical value of the signal at the data input terminal 122.

In the self-gating flip-flop circuit 100, the clock input terminal 118 is connected to only the clock gate circuit 108 and the latch reset circuit 110. In the clock gate circuit 108 and the latch reset circuit 110, the clock input terminal 118 may be connected to only two logic gates 114 and 116, which may connect the clock input terminal 118 to only four transistors of the two logic gates 114 and 116. Because the clock signal (received via the clock input terminal 118) switches only four transistors in the self-gating flip-flop circuit 100, the power consumption of the self-gating flip-flop circuit 100 is reduced relative to flip-flop circuits that connect the clock signal to more than four transistors.

Figure 2:
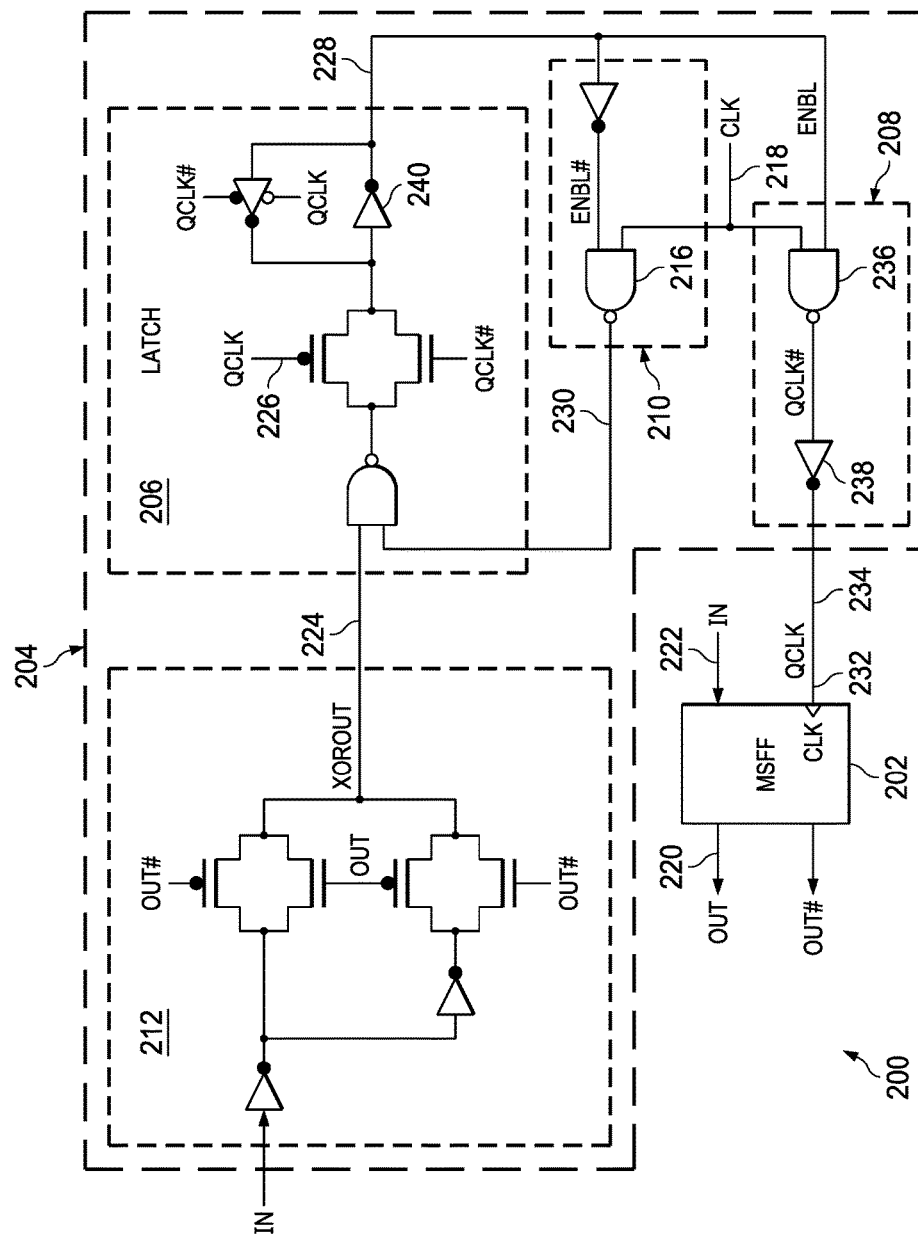
FIG. 2 is a low-level schematic diagram of an example self-gating flip-flop circuit in accordance with the described examples.

FIG. 2 is a low-level schematic diagram of an example self-gating flip-flop circuit 200 in accordance with the described examples. The self-gating flip-flop circuit 200 is an implementation of the self-gating flip-flop circuit 100. The self-gating flip-flop circuit 200 includes a flip-flop circuit 202 and a flip-flop clock circuit 204. The flip-flop clock circuit 204 is coupled to the flip-flop circuit 202 and provides an internal clock signal 234 to the flip-flop circuit 202 if the logical value of the data stored in the flip-flop circuit 202 is different from the logical value of the signal at the data input terminal 222. For example, if the value stored in the flip-flop circuit flip-flop circuit 202 (i.e., at the output 220 of the flip-flop circuit 102) is a logic "0", and if the signal at the data input terminal 222 is a logic "1", then the flip-flop clock circuit 204 will pass a clock to the flip-flop circuit 202, and the flip-flop circuit 202 will store the value of the signal that exists at the data input terminal 222. The flip-flop circuit 202 may be a master-slave flip-flop.

The flip-flop clock circuit 204 includes a latch circuit 206, a clock gate circuit 208, a latch reset circuit 210, and an exclusive-OR circuit 212. The exclusive-OR circuit 212 compares the value of the data stored in the flip-flop circuit 202 to the value of the signal at the data input terminal 222, and provides the result of the comparison to the latch circuit latch circuit 206. The exclusive-OR circuit 212 is connected to the data input terminal 222, the flip-flop circuit 202, and the latch circuit 206. The exclusive-OR circuit 212 may be implemented as an exclusive-OR (XOR) gate.

The latch circuit 206 receives the output of the exclusive-OR circuit 212. The latch circuit 206 is coupled to the exclusive-OR circuit 212, the clock gate circuit 208, and the latch reset circuit 210. The latch circuit 206 includes a data input terminal 224 that is coupled to the exclusive-OR circuit 212. The latch circuit 206 is configured to pass or store the output of the exclusive-OR circuit 212 for use by the clock gate circuit 208. The latch circuit 206 includes a latch control input 226 for receiving a signal that controls whether the latch circuit 206 passes or stores the output of the exclusive-OR circuit 212. The latch control input 226 is coupled to the clock gate circuit 208 to allow the clock signal generated by the clock gate circuit 208 to control whether the latch circuit 206 passes or stores the output of the exclusive-OR circuit 212. For example, if an internal clock signal 234 generated by the clock gate circuit 208 is active, then the latch circuit 206 latches the output of the exclusive-OR circuit 212. Conversely, if the internal clock signal 234 generated by the clock gate circuit 208 is inactive, then the latch circuit 206 passes the output of the exclusive-OR circuit 212. The signal output of the latch circuit 206, irrespective of whether passed or latched, is provided on a latch data output terminal 228. The latch circuit 206 also includes a reset terminal 230 for receiving a signal that controls resetting of the latch circuit 206.

The latch data output terminal 228 is coupled to the clock gate circuit 208 and the latch reset circuit 210. The clock gate circuit 208 generates the internal clock signal 234, which is provided to the clock input 232 of the flip-flop circuit 202 and to the latch control input 226 of the latch circuit 206. The clock gate circuit 208 is coupled to the latch data output terminal 228 and the clock input terminal 218, and receives (as its inputs) the output of the latch circuit 206 and the clock signal at the clock input terminal 218. If the output of the latch circuit 206 is active (indicating that the logical value of the data stored in the flip-flop circuit 202 is different from the logical value of the signal at the data input terminal 222), and if the clock signal at the clock input terminal 218 is active, then the clock gate circuit 208 generates the internal clock signal 234 by passing a clock received via the clock input terminal 218. In some implementations of the self-gating flip-flop circuit 200, the clock gate circuit 208 is implemented as a NAND gate 236 coupled to an inverter 238 to provide two phases of the internal clock signal 234.

The latch reset circuit 210 generates the reset signal, which is provided to the reset terminal 230 to control resetting of the latch circuit 106. The latch reset circuit 210 is coupled to the latch data output terminal 228 and the clock input terminal 218, and receives (as its inputs) the output of the latch circuit 206 and the clock signal at the clock input terminal 218. If the output of the latch circuit 206 is inactive (indicating that the logical value of the data stored in the flip-flop circuit 202 is the same as the logical value of the signal at the data input terminal 222), and if the clock signal at the clock input terminal 218 is active, then the clock gate circuit 208 generates a signal to reset the latch circuit 206. The clock gate circuit 208 may be implemented as a "NAND" gate 216. Thus, the latch reset circuit 210 holds the latch circuit 206 reset while: the clock signal at the clock input terminal 218 is "high"; and the logical value of the data stored in the flip-flop circuit 202 is the same as the logical value of the signal at the data input terminal 222.

In the self-gating flip-flop circuit 200, the clock input terminal 218 is connected to only the NAND gate 216 and the NAND gate 236. Within the NAND gate 216, the clock input terminal 218 may be connected to only two transistors. Within the NAND gate 236, the clock input terminal 218 may be connected to only two transistors. Because the clock signal (received via the clock input terminal 218) switches only four transistors in the self-gating flip-flop circuit 200, the power consumption of the self-gating flip-flop circuit 200 is reduced relative to flip-flop circuits that connect the clock signal to more than four transistors.

Figure 3:
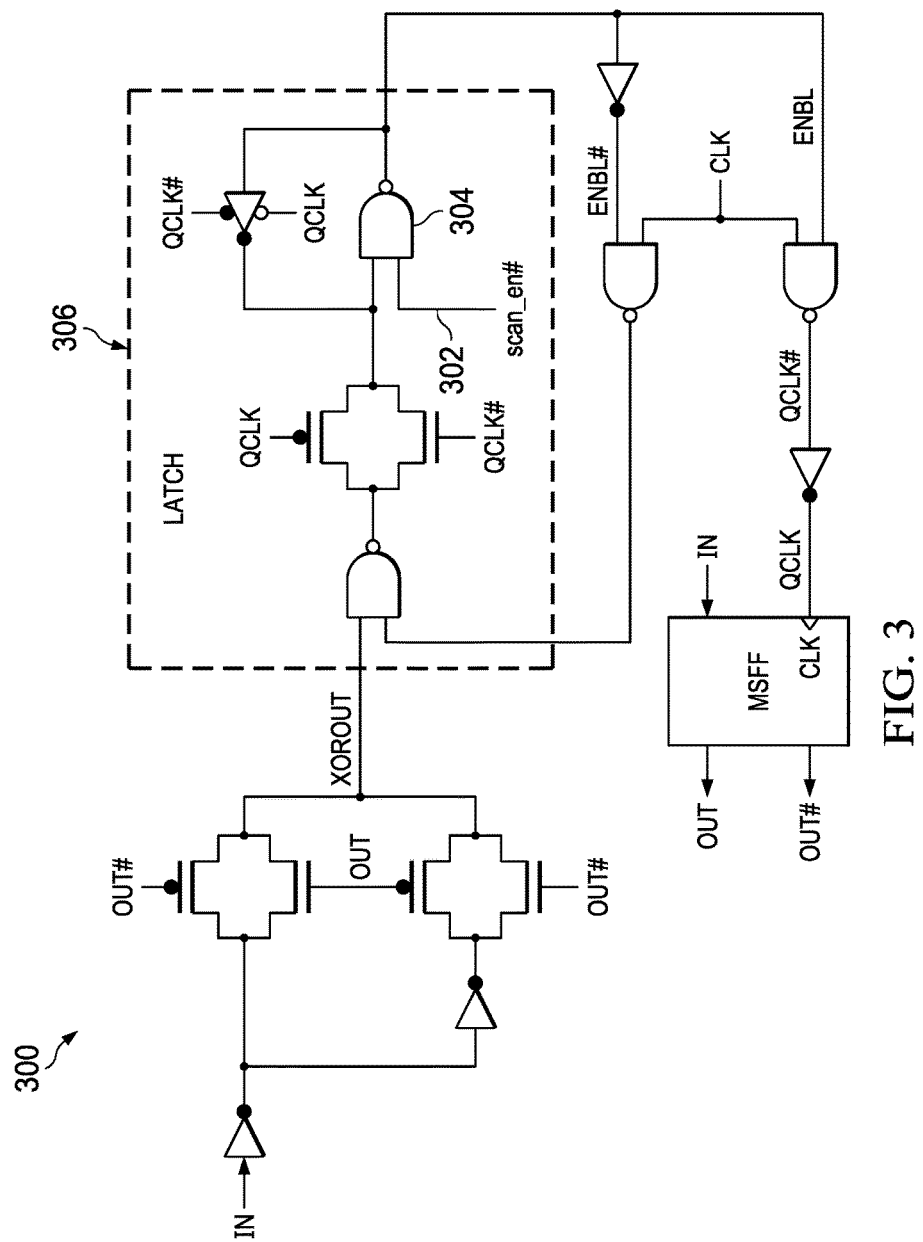
FIG. 3 is a low-level schematic diagram of an example self-gating flip-flop circuit in accordance with the described examples.

FIG. 3 is a low-level schematic diagram of an example self-gating flip-flop circuit 300 in accordance with the described examples. The self-gating flip-flop circuit 300 is an implementation of the self-gating flip-flop circuit 100. The self-gating flip-flop circuit 300 is similar to the self-gating flip-flop circuit 200, and incudes features that allow the self-gating flip-flop circuit 300 to be used in a scan chain, such as a joint test action group (JTAG) scan chain. The self-gating flip-flop circuit 300 includes a scan enable terminal 302. The scan enable terminal 302 is connected to the latch circuit 306. The latch circuit 306 is similar to the latch circuit 206, and includes a NAND gate 304 in place of the inverter 240 of the latch circuit 206. If a scan enable signal (received at the scan enable terminal 302) is active, then the signal output of the latch circuit 306 enables the clock gate circuit 308 to pass the clock signal (received at the clock input terminal 318) to the flip-flop circuit 302.

Figure 4:
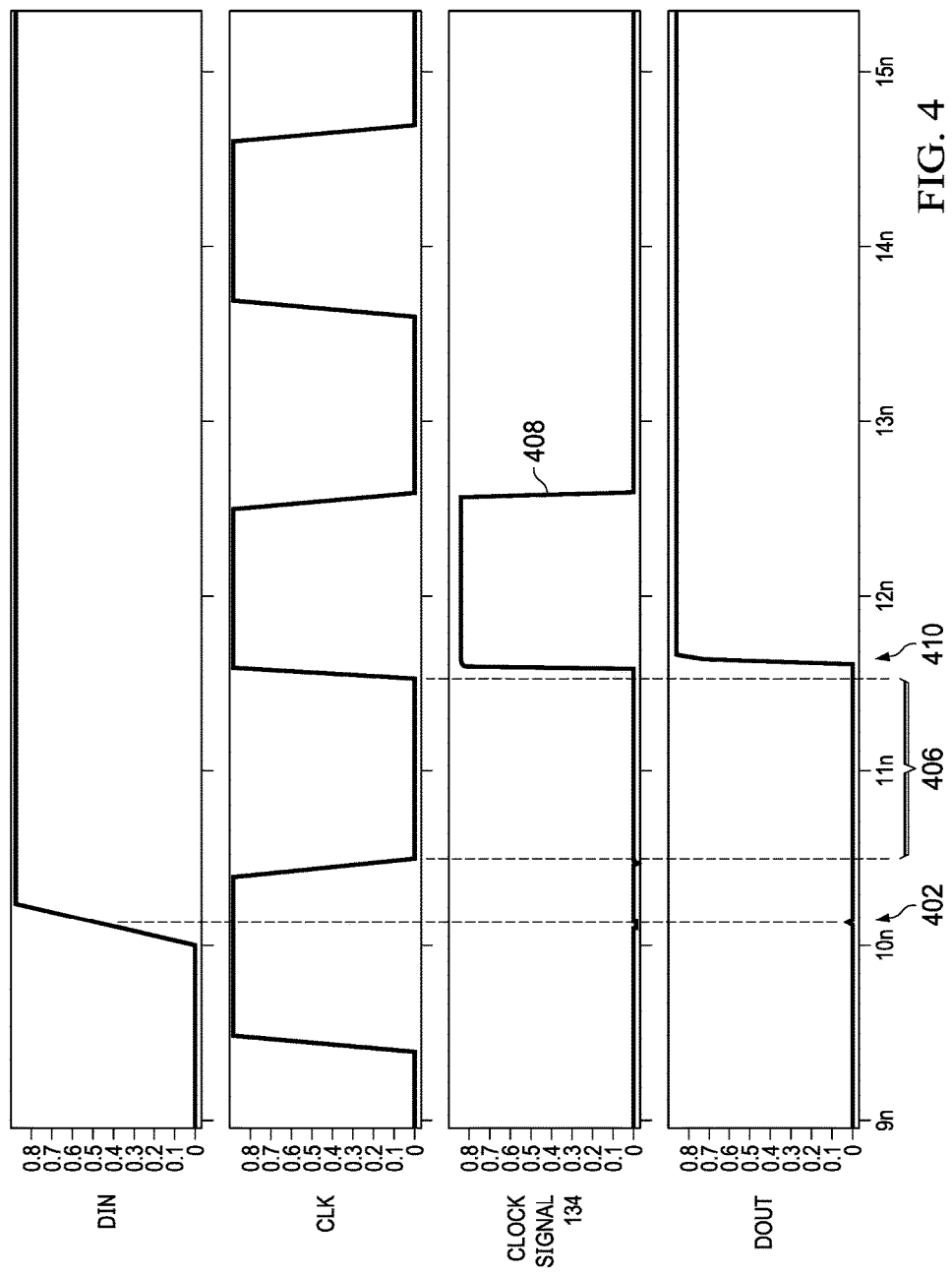
FIG. 4 is a timing diagram of an example self-gating flip-flop circuit in accordance with the described examples.

FIG. 4 is an example timing diagram for operation of the self-gating flip-flop circuit 100. At time 402, the output of the flip-flop circuit 102 is "low," and the signal DIN at the data input terminal 122 transitions from "low" to "high." The signal output by the exclusive-OR circuit 112 indicates the difference in the output (DOUT) of the flip-flop circuit 102 and the signal DIN at the data input terminal 122. Responsive to the output of the exclusive-OR circuit 112, the latch circuit 106 output signal is active in interval 406, and the clock gate circuit 108 activates the internal clock signal 134 (clock pulse 408) to latch the latch circuit 106 and clock the signal DIN into the flip-flop circuit 102, thereby changing the output (DOUT) of the flip-flop circuit 102 at 410.

Modifications are possible in the described embodiments, and other embodiments are possible, within the scope of the claims.

What is claimed is:

1. An integrated circuit, comprising:
   a clock input terminal;
   a flip-flop circuit having a flip-flop clock input, a data input terminal and a data output terminal; and
   a clock circuit including:
      a latch circuit having a reset input, a latch control input, a latch data input and a latch data output;
      a reset circuit having a first input coupled to the clock input terminal, a second input coupled to the latch data output, and a reset output coupled to the reset input; and
      a gate circuit having a first input coupled to the clock input terminal, a second input coupled to the latch data output, and a gate output coupled to the flip-flop clock input.

2. The integrated circuit of claim 1, further comprising:
   an exclusive-OR circuit having: a first input coupled to the data input terminal, a second input coupled to the data output terminal, and an exclusive-OR output coupled to the latch data input.

3. The integrated circuit of claim 1, wherein the latch control input is coupled to the gate output.

4. The integrated circuit of claim 1, wherein the gate circuit is configured to generate a clock edge at the gate output responsive to: a signal at the latch data output; and an edge of an input signal at the clock input terminal.

5. The integrated circuit of claim 1, wherein the reset circuit is configured to provide a reset signal at the reset output responsive to: an input signal at the clock input terminal; and a signal at the latch data output indicating that a first logical value at the data input terminal is same as a second logical value at the data output terminal.

6. The integrated circuit of claim 1, wherein the latch circuit has a scan enable terminal and is configured to provide a signal at the latch data output responsive to a signal at the scan enable terminal.

7. The integrated circuit of claim 1, wherein the clock input terminal is connected to no more than four transistors of the clock circuit.

8. An integrated circuit, comprising:
   a data input terminal;
   a clock input terminal;
   a flip-flop circuit having: a flip-flop data input coupled to the data input terminal; a flip-flop clock input; and a flip-flop data output;
   a clock circuit including: a latch circuit having a reset input and a latch data output; a reset circuit having a first input coupled to the clock input terminal, a second input coupled to the latch data output, and a reset output coupled to the reset input; and a gate circuit having a first input coupled to the clock input terminal, a second input coupled to the latch data output, and a gate output coupled to the flip-flop clock input; the clock circuit configured to:
      latch a signal at the latch data output responsive to a first logical value at the data input terminal being different from a second logical value at the flip-flop data output; and
      provide a clock signal at the gate output responsive to the signal at the latch data output.

9. The integrated circuit of claim 8, wherein the latch circuit is configured to latch the signal at the latch data output responsive to the first logical value being different from the second logical value.

10. The integrated circuit of claim 8, wherein the reset circuit is configured to provide a reset signal at the rest output responsive to: the signal at the latch data output; and data input signal at the clock input terminal.

11. The integrated circuit of claim 8, wherein the clock circuit is configured to provide the clock signal at the gate output responsive to: the signal at the latch data output; and an input signal at the clock input terminal.

12. The integrated circuit of claim 8, wherein the latch circuit has a scan enable terminal and is configured to provide a signal at the latch data output responsive to a signal at the scan enable terminal.

13. The integrated circuit of claim 8, wherein the latch circuit has a latch data input, and the integrated circuit further comprises an exclusive-OR circuit having: a first input coupled to the data input terminal, a second input coupled to the flip-flop data output, and an exclusive-OR output coupled to the latch data input, the exclusive-OR circuit configured to determine whether the first logical value is different from the second logical value.

14. The integrated circuit of claim 8, wherein the clock input terminal is connected to no more than four transistors of the clock circuit.

15. An integrated circuit, comprising:
a data input terminal;
a clock input terminal;
a flip-flop circuit having: a flip-flop data input coupled to the data input terminal; a flip-flop clock input; and a flip-flop data output;
an exclusive-OR circuit having: a first input coupled to the data input terminal; a second input coupled to the flip-flop data output; and an exclusive-OR output;
a latch circuit having: a reset input; a latch control input; a latch data input coupled to the exclusive-OR output; and a latch data output;
a reset circuit having: a first input coupled to the clock input terminal; a second input coupled to the latch data output; and a reset output coupled to the reset input; and
a gate circuit having: a first input coupled to the clock input terminal; a second input coupled to the latch data output; and a gate output coupled to the flip-flop clock input and to the latch control input;
the gate circuit configured to provide a clock signal at the gate output responsive to a signal at the latch data output;
the latch circuit configured to: transfer a signal from the latch data input to the latch data output responsive to absence of the clock signal; and latch the signal at the latch data output responsive to the clock signal.

16. The integrated circuit of claim 15, wherein the reset circuit is configured to provide a reset signal at the output responsive to: an input signal at the clock input terminal; and the signal at the latch data output indicating that a first logical value at the data input terminal is same as a second logical value at the flip-flop data output.

17. The integrated circuit of claim 15, wherein the gate circuit is configured to provide the clock signal responsive to: an input signal at the clock input terminal; and the signal at the latch data output indicating that a first logical value at the data input terminal is different from a second logical value at the flip-flop data output.

* * * * *